SEMICONDUCTOR SWITCH

Original Filed Sept. 3, 1963

INVENTOR:
FINIS E. GENTRY,

BY [signature]
HIS ATTORNEY.

3,303,360

SEMICONDUCTOR SWITCH

Finis E. Gentry, Skaneateles, N.Y., assignor to General Electric Company, a corporation of New York Original application Sept. 3, 1963, Ser. No. 306,147, now Patent No. 3,265,909. Divided and this application Jan. 21, 1966, Ser. No. 522,141
3 Claims. (Cl. 307—88.5)

This application is a division of our copending application, Serial Number 306,147, filed September 3, 1963, now Patent No. 3,265,909 and assigned to the assignee of the present invention.

This invention relates to semiconductor switches of the type which can be switched between two states of impedance, i.e., between a high impedance and a low impedance. In particular, the invention relates to such switches which can be changed from a state of low impedance to a state of high impedance and from a state of high impedance to a state of low impedance. Stated in another way, the invention relates to such semiconductor switches which can be changed from a highly conductive state to a much less conductive state (turned off) and also switched from the essentially non-conductive state to the highly conductive state (turned on). The invention is concerned with a semiconductor switching device which can be composed of an NPN or PNP transistor and a four layer PNPN or NPNP semiconductor gate turn-off switch (called a GTO) either as two devices or a composite device. The composite device may be comprised of one or more semiconductor pellets.

Semiconductor switches have become an important component in a wide variety of control applications, particularly PNPN three terminal devices of the type frequently referred to as silicon controlled rectifiers. Operation of such devices is described in Chapter 1 of the General Electric Controlled Rectifier Manual, second edition, copyright 1961 by the General Electric Company, the article by Moll, Tanenbaum, Goldey and Holonyak in Proceedings of the IRE, September 1956, volume 44, pages 1174 to 1182, and in the copending patent application, Serial Number 838,504, entitled, "Semiconductor Devices and Methods of Making Same," filed September 8, 1959 in the name of Nick Holonyak, Jr. and Richard W. Aldrich and assigned to the assignee of the present application. The semiconductor switch is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it presents a very low impedance device (essentially a short circuit).

The usual mechanism for rendering the PNPN switches conductive is to introduce current into a third lead or terminal (called the gate lead) which increases the current flowing through the device and thereby renders the device conductive. This action is descriptively referred to as triggering the device or turning it on. When the device is triggered into the high conduction mode, the gate lead has very little control over the device and the only method of turning the device off is to reduce the current between the device anode and cathode (the main conduction path) below a given level called the holding current level.

These PNPN switch devices have been made extremely sensitive to triggering (turn on) injection current at the gate terminal. That is, they have been made so that an extremely small gate injection current can be used to change the device from its high impedance state to its high conduction mode. However, it has been extremely difficult to switch the device from its high conduction mode to the low conduction mode of operation utilizing current removal at the gate lead. A number of approaches to making the devices more sensitive to being turned off by gate current removal have been quite successful. For example, see the copending patent applications entitled "Semiconductor Switch," Serial Number 210,364, filed July 17, 1962, in the name of Nick Holonyak, Jr., now U.S. Patent 3,239,728 and Richard W. Aldrich and Serial Number 285,385, filed June 4, 1963, in the name of Joseph Moyson and James Petruzella, now U.S. Patent 3,242,551 and both assigned to the assignee of the present invention. Although these inventions have resulted in commercial devices which are quite useful and successful, there is a demand for devices with even greater sensitivity to a turn off signal than can now be obtained with these devices using presently available materials and techniques.

The present invention is responsive to these demands. The demands are satisfied by providing the combination of a three layer and a four layer semiconductor device either as two separate units or, as preferred, in a single composite semiconductor pellet. The combination is made in such a way that the three layer device is in the main load current carrying path and the four layer device supplies its base current. Thus, the mechanism for turning both type devices off must be considered.

Since the three layer device (transistor) may be turned off (changed from its low impedance to its high impedance mode) by discontinuing its base current, this mechanism is not explained in detail. It should suffice to say that this is the case and that discontinuance of this base current, in the devices considered, is dependent upon turning off the four layer device which supplies the base current. However, the turn off mechanism of the four layer PNPN switch is more complex and does require a more detailed explanation.

To understand the gate turn off mechanism of the four layer PNPN switch it is necessary to understand a few of the operating principles and characteristics of 4 layer, 3 terminal switching elements. The operation of these devices is generally well understood. However, certain aspects of the operation of these devices is so crucial to an understanding of the present invention that a somewhat simplified physical description of the operation is given here.

The heart of the four layer switch is generally a pellet of monocrystalline semiconductor material such as silicon which has four layers of alternate conductivity type, i.e., 4 layers which alternately have an excess of positive holes (P type material) and an excess of negative electrons (N type material) with a barrier or junction between the layers. Thus, the device is called a PNPN or NPNP semiconductor device to describe the four layers of alternate conduction types. One of the easiest ways to understand the operating principles is to consider a 4 layer PNPN device (see FIGURE 1A) to consist of a PNP and an NPN transistor (FIGURES 1*b* and 1*c* respectively) with the center junction $J_c$ and the two center layers common to both transistors.

It is generally recognized that a semiconductor device consisting of two layers of different conductivity types (i.e., a PN device) readily conducts current in one direction but blocks current in the opposite direction. For example, if a voltage is applied across such a PN device which is positive at the P type layer and negative at the N type layer, the device readily conducts current whereas the device blocks current flow when the reverse voltage is applied. Simply stated, the reason the device readily conducts when a voltage is applied across it which is positive at the P type layer is that the positive voltage repels P type carriers at one end of the device and the negative voltage repels the negative electrons at the other end. Thus, the P and N type conduction carriers are moved toward and across the junction. With the opposite polarity applied, i.e., the junction reverse biased, the holes and electrons are attracted away from the junction. This forms a depletion region at the junction which is relatively free of both P and N type carriers. A charge appears across the depletion region (and junction), much as in a common capacitor, which opposes current flow. This condition can be broken down and current forced through the device by raising the reverse voltage to a sufficiently high value.

Now consider the PNPN device with a positive potential at the P type end layer and a negative potential at the N type end layer in the light of this discussion. It is seen that the junctions between the two outer end layers (at both ends) tend to conduct whereas the center junction, $J_c$, between the N and P type layers tends to block current flow through the device. In other words, each of our two conceptual transistors which make up the PNPN device has one junction which tends to block current flow through the device. Like the PN device discussed above, the PNPN device can be made to conduct by raising the voltage across it to some high value which forces conduction across the center junction $J_c$. It may also be made to conduct by introducing the proper amount of current through a gate lead on one of the intermediate layers to cause a change of the charge condition across the center junction $J_c$.

The total current flowing in the PNPN structure can be pictured as the sum of currents flowing in each of the individual conceptual transistor sections. Current flow in each section depends upon having current supplied to its base by the other section. That is to say that conduction of the PNP section depends on electron current from the end N type layer to the internal N type layer (base of the PNP transistor) and conduction of the NPN section depends upon flow of hole current from the end P layer to the internal P type layer (base of the NPN transistor). Without these currents the proper charge cannot be maintained across the center junction $J_c$ to support current flow.

Conditions for the device to be conducting can be stated in terms of the current gain of the individual sections. In fact, the concept of current gain $\alpha$ in each of the transistor sections (i.e., in each part of the total PNPN structure) is so fundamental to an understanding of turn off gain that a digression is made here to explain this concept. The current gain $\alpha$ is defined as the fraction of current injected at the emitter of each of the transistors which reaches the collector of that transistor. In other words, in the conceptual PNP transistor the current gain $\alpha_{pnp}$ defines the fraction of the current through the emitter (the end P type layer which has the positive voltage applied to it) which reaches the collector (i.e., the internal P type layer which is negatively biased). Thus, $\alpha_{pnp}$ is defined by the ratio of the collector current to the emitter current and in this particular transistor section the predominan current flow is hole current. The current gain of the NPN conceptual transistor section, $\alpha_{npn}$ defines the fraction of current through the emitter (the end N type layer which is biased negatively) that reaches the collector (the internal N type region which is positively biased).

The total current of the device at the center junction $J_c$ is composed of the hole current from the end P region, the electron current from the end N region and a small leakage or thermally generated current. It is known that the device is highly conductive (on) when the sum of the current gains ($\alpha$'s) of the two transistor sections is unity and off or nonconductive when the sum of the current gains in the two transistor sections is less than unity, e.g., 0.9. The current gains ($\alpha_{pnp}$ and $\alpha_{npn}$) increase as the collector to emitter voltage is increased but only slightly until the device (the normally blocking junction $J_c$) breaks down and then appreciable current flows. The current gain then increases rapidly as the emitter current is increased.

The gate lead which may be connected to the internal P type conduction layer provides a very effective way of increasing the emitter current. That is to say that the emitter current is easily increased through transistor action by introducing current, $I_G$, at the gate lead. The mechanism for switching the device from its state of high impedance to its state of low impedance is well understood. As indicated above, it is also understood that the device may be switched from its on condition (its low impedance condition) by decreasing the current supplied to the base of either transistor section to such a low value that the center junction $J_c$ again becomes a blocking junction, i.e., unsaturated or reverse biased. This may be done by decreasing the voltage across the device until it can no longer support the necessary current flow.

Another mechanism for doing this is to extract current at the gate lead. This "drains" positive carriers from the internal P type base region and reduces the voltage across the emitter junction which in turn reduces the flow of negative carriers from the N type end region and effectively "starves" the junction $J_c$. The reduced flow of electrons across the junction $J_c$ into the internal N type region results in a reduced voltage across the junction which also reduces the flow of positive holes from the end P type emitter region. If the withdrawn gate current is large enough, the center junction $J_c$ returns to its normally blocking condition. This effect takes place in a very short time, e.g., a few microseconds. This latter mode of operation is not used in most PNPN semiconductor switches because the current which must be withdrawn in order to turn the device off approaches the normal conduction current of the device.

For an understanding of the way a practical gate turn off switch is built, reference is again made to the conceptual pair of transistors illustrated in FIGURES 1, 1B and 1C. Assume that the gate lead is connected to the central P type layer (base layer) of the NPN transistor (FIGURE 1C) and consider the situation when the device is conducting. A portion of the current through the device is supplied by the PNP transistor and the magnitude of this current is dependent upon its gain $\alpha_{pnp}$. If the PNP transistor section of the device supplies a current which is much greater than the current required to keep the "normally blocking center junction $J_c$" from becoming nonconductive, then it becomes very difficult to remove enough current at the gate lead to turn the device off. Actually, under these conditions the current withdrawn by the gate may not reach a sufficiently high value to turn the device off until it almost equals the device current itself. This suggests that the current gain of the PNP region should be reduced to the point that it supplies little if any more than just that current required to keep the center junction $J_c$ conductive when no gate current is flowing. This current limit requirement is met if the current gain of the device is made to approach zero.

It is well understood that the requirement for a device to turn on is that the sum of the current gains $$(\alpha_{pnp}+\alpha_{npn})$$

of the conceptual transistors approach unity. Thus, if the current gain of the PNP section of the device approaches zero then the current gain of the NPN section of the device should approach unity. A device which can readily be turned off results when the ratio of the current gain of the NPN transistor section to the current gain of the PNP section is about an order of magnitude or more.

Pursuing this line of reasoning has led workers skilled in the art to suppress the current gain of one of the conceptual transistors ($\alpha_{pnp}$ in the illustrated device). There are a number of ways to achieve this result but one of the best ways to restrict current gain of a three layer device is to limit the efficiency of one of the device emitters. For example, one means of reducing emitter efficiency is to provide a shorting electrode and another is to provide an emitter with a sheet resistance which is very high in comparison to the sheet resistance of the base.

One of the more sophisticated approaches takes advantage of the fact that the current gain of each individual conceptual transistor varies with load current, hence, the sum of current gains ($\alpha_{npn}+\alpha_{pnp}$) varies with total current through the device. This approach provides a structure wherein the device characteristics are tailored such that the sum of current gains ($\alpha_{pnp}+\alpha_{npn}$) is very nearly unity at a very low device current (e.g., 100 milliamperes or less), is very nearly unity at the peak value of device current which is to be turned off by the device gate and is at least unity for all device currents in between. Since the sum current gains is unity at a low load current, the device holding current and, hence, turn on current is low. The fact that the sum of current gains is very near unity at the peak load current (total device current) which is to be turned off, the gate current required to switch the device to its low impedance state is relatively low and, hence, the device has a high turn off gain.

When used in this sense, turn off gain is defined as the ratio of current flowing in the load when the switch is on to the gate current required to turn the switch off. In one particular device, a load current of 600 milliamperes is turned off with an 8 milliampere gate current to provide a turn off gain of 75.

A more complete discussion of these approaches may be found in the Nick Holonyak, Jr. and Richard W. Aldrich patent application and the Joseph Moyson and James Petruzella patent application referred to above. The present invention contemplates the use of any of the turn-off gain enhancing mechanisms in the four layer portion of the device.

The present invention provides a switch with a turn off gain more than an order of magnitude (typically fifty times) as great as the four layer GTO.

In carrying out the present invention a three layer semiconductor device (transistor) which presents a low impedance when base current is supplied and a high impedance when no base current flows, is used as a main current conducting path for a three terminal switch which can be turned on and off. The base current for the three layer device is supplied by a four layer semiconductor switch which can be turned on and off thereby to supply or interrupt the base current to the three layer device. In the preferred embodiment the three and four layer semiconductor devices constitute a unitary composite structure.

The features which are believed to be characteristic of the invention are set forth with particularity in the appended claims. The invention itself, however, both as to its organization and advantages thereof may best be understood by reference to the following description taken in connection with the accompanying drawing in which:

Figure 3:
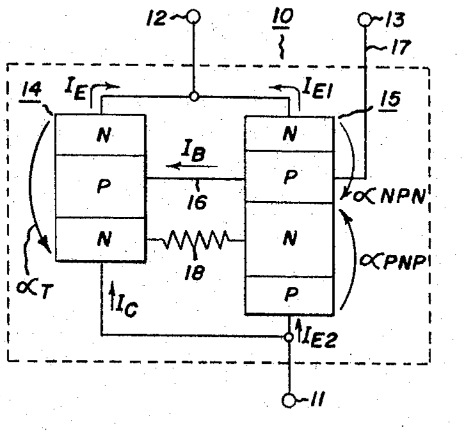
Figure 4:
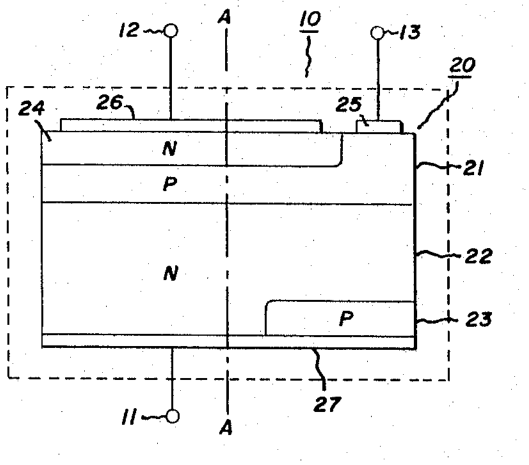

FIGURE 3 illustrates one embodiment of a three terminal semiconductor switch composed of a four layer semiconductor switch and a transistor which circuit arrangement is also a schematic representation of the equivalent circuit for the composite device of FIGURE 4; and FIGURE 4 is a sectional view of a composite three leaded semiconductor switching device constructed in accordance with teachings of this invention.

Since the semiconductor switching device of the invention utilizes a three layer transistor as the main current carrying path and the transistor is either in its state of high impedance or low impedance depending upon whether current is supplied to its base region by a four layer semiconductor switch it is apparent that the key to understanding the turn off mechanism is an understanding of the turn off mechanism of the four layer device.

Figures 1A, 1B, 1C:
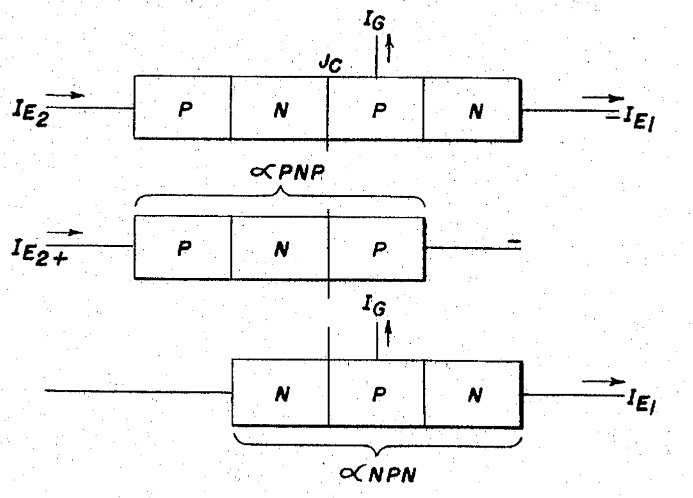
FIGURE 1A is a schematic representation of a four layer, three terminal PNPN switch used in the description and analysis of the present invention (including the above description)
FIGURES 1B and 1C are conceptual PNP and NPN transistors constructed from the four layer device of FIGURE 1A which are analyzed individually and superimposed in the above explanation of the concepts of the four layer switch used in the present invention.

In order to obtain a better understanding of the turn off mechanism of the four layer PNPN switch a simple one dimensional analysis is given utilizing the typical four region PNPN structure schematically represented in FIGURE 1A. Before beginning the analysis, however, it should be recognized that a three terminal PNPN switch cannot be described accurately by a one dimensional model, except at very low current levels. Even so, the analysis provides considerable insight into the problems involved in both turning on and turning off such switches.

As pointed out above, the four zone, three terminal PNPN switch illustrated in FIGURE 1A has contacts fixed to the two end regions and a gate lead attached to one of the base layers (the internal P region as illustrated). Assume an external voltage applied across the switch which is positive at the end P region and negative at the end N region. For this polarity the current flows through the device as indicated by the arrows from the external P type region to the external N type region. The current flowing into the external P type region is designated as $I_{E2}$, the current flowing out from the external N type region is designated as $I_{E1}$ and the current flowing in the gate lead is designated as $I_G$. As above, the current gain for the PNP region is designated as $\alpha_{pnp}$ and the current gain for the NPN region is designated as $\alpha_{npn}$. If some leakage currents are neglected, the following equations can be written to describe the currents in the turned on device:

(1) $$I_{E2}\alpha_{pnp}-I_G=(1-\alpha_{npn})I_{E1}$$

(2) $$I_{E1}\alpha_{npn}=(1-\alpha_{pnp})I_{E2}$$

solving for $I_{E2}$ the following equation is obtained:

(3) $$I_{E2}=I_G\frac{\alpha_{npn}}{\alpha_{npn}+\alpha_{pnp}-1}$$

To determine the requirements for turning off the device, the device is considered to be in the conduction state with an external current to the load flowing which is determined principally by the magnitude of the external power supply voltage and the resistance of the load connected to the device. As was indicated previously, the center junction in the device, i.e., the junction between the internal N and P regions (labeled $J_c$) is a junction which normally opposes current flow in the direction indicated. When current is flowing, a voltage appears across the junction $J_c$ which is in a direction to maintain or substain current flow through the junction. In other words, the junction voltage changes from its blocking direction in the non-conduction state to "forward bias" in its conducting state. Thus, it is apparent that the voltage across this junction varies. By this mechanism, the current in the device and the current gains ($\alpha$'s) of the two sections of the device change. Once the device is conducting, the change of the $\alpha$'s is in a direction to supply exactly enough base current for each transistor section to maintain the current flow. If the current is removed from one of the bases the load current drops unless the current gains ($\alpha$'s) can readjust (increase) themselves.

For a given load current there is a maximum value possible for each of the α's. As the outflow of gate current is increased, the α of the NPN section (the section having the gate lead attached to its base) decreases until $(\alpha_{npn}+\alpha_{pnp})$ is less than one. At this point, the device switches to the off state.

To find the gate current $I_G$ required to turn off a given load current, $I_{E2}$, the α's are assumed to have their maximum values (for the currents $I_{E2}$ and $I_{E1}$). We assume that $I_{E2}$ has a minimum possible value $I_M$ with the gate current $I_G$ and $I_H$ is the holding current necessary to maintain the device in its on condition where $I_G=0$. We define turn off capability $\beta_{off}$ as a ratio of change in minimum hold current to the gate current $I_G$. This parameter is sometimes called turn off gain but, as previously indicated, for the present discussion turn off gain is defined as the ratio of load current to the gate current required to turn it off. The turn off capability parameter is considered important since it expresses the change in holding current $I_H$ at different levels of load current. The following equation defines turn off capability for the device:

(4)
$$\beta_{off}=\frac{I_M-I_H}{I_G}=\frac{I_M}{I_G}\left(1-\frac{I_H}{I_M}\right)$$

Then substituting from Equation 3 above turn off capability (5)
$$\beta_{off}=\left(\frac{\alpha_{npn}}{\alpha_{npn}+\alpha_{pnp}-1}\right)\left(1-\frac{I_H}{I_M}\right)$$

or if $I_M$ is much larger than $I_H$ (6)
$$\beta_{off}=\frac{\alpha_{npn}}{\alpha_{npn}+\alpha_{pnp}-1}(I_M>>I_H)$$

It turns out that this is precisely the expression which can be arrived at for turn off gain when starting with the definition given above. This, of course, is to be expected since the turn off gain definition initially ignores holding current $I_H$ and this expression is arrived at assuming the holding current term $I_H/I_M$ is negligible.

In general, the way that the α's vary as a function of current is unknown. Experiments indicate that it is possible to have both α's approach unity at moderate currents (as, for example, a result of fields developed by ohmic current flow). Under these conditions the turn off gain then also approaches unity. It is clear then that the turn off gain can be high if some means can be found to restrict one or both of the α's. For the expression above (Equation 6) it is clear that the better turn off gain is achieved if the $\alpha_{pnp}$ is restricted.

An inspection of the equation for the turn off gain (6) shows that the individual current gains $\alpha_{npn}$ and $\alpha_{pnp}$ should have a sum very nearly unity for maximum turn off gain and that the turn off gain can be high if a means is found to restrict one or both of the individual current gains (α's). Since the $\alpha_{npn}$ appears in the numerator (for the device structure illustrated) it becomes apparent that maximum effect will be obtained if $\alpha_{pnp}$ is the one which is suppressed. A consideration of these equations also shows that in order for a PNPN or NPNP device to exhibit a switching characteristic (from high to low impedance) the current gain (α) of at least one section of the device must increase with current. That is to say, that since the sum of the α's of the section must be greater than one to exhibit turn on gain and since the sum of the α's must be less than unity in order to have turn off gain it is apparent that at least one component transistor structure must have an α which varies with current if both turn on and turn off gain are to be exhibited.

One approach to enhance the turn off gain of the device which follows is to suppress the one current gain $(\alpha_{pnp})$ so that its maximum value is near zero (e.g., 0.1 or less) and adjust the other current gain so that it rapidly increases with load current to a value as near unity as possible. Ways to accomplish this are described in the copending Holonyak and Aldrich patent application, supra. Another approach is to suppress the one current gain $(\alpha_{pnp})$ to a certain degree but more important, the current gain characteristic (i.e. variation of current gain with load current) is tailored so that $\alpha_{pnp}+\alpha_{npn}$ is unity at a low value of load current and very nearly unity at the maximum load current to be turned off. This is accomplished through the proper use of conductivity modulation in the conceptual transistor having the gate lead connected to its collector (i.e., the PNP device as illustrated).

This approach is described in the copending Moyson and Petruzella application, supra, however, this approach is so amenable to application in the four layer turn off switch portion of the present invention that more insight into the means for restricting current gain and tailoring the current gain vs. load current characteristic is given here for the sake of giving the reader a complete understanding.

It is recognized that the current gain α of a four layer PNPN switch is basically composed of two parameters vis: γ the emitter efficiency and T, the transport factor. α is simply the product of these two quantities, that is (7)
$$\alpha=\gamma$$

Now γ is principally determined by the relative impurity concentration of the layers on opposite sides of junction and for not too high or too low injection levels is given by the following equation:

(8)
$$\gamma=\frac{1}{1+\frac{\sigma_B W_B}{\sigma_E L_E}}$$

where $L_E$ is the diffusion length for minority carriers on the emitter side of the junction, $W_B$, is the base width, $\sigma_B$ and $\sigma_E$ are conductivities of the base and emitter regions respectively. The emitter width $W_E$ may be substituted for the diffusion length $L_E$ in the case of the present invention since emitter width will normally be less than a diffusion length.

Figure 2:
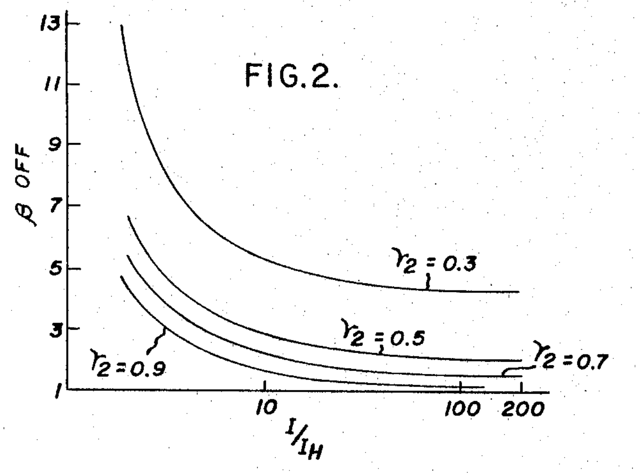
FIGURE 2 is a graph showing calculated values of turn off capability $\beta_{off}$ plotted along the axis of ordinates against the ratio of device current I to hold current $I_H$ plotted along the axis of abscissas for a number of values of emitter injection efficiency $\gamma_{E2}$.

Now consider the means of restricting and tailoring the current gain. First consider the point of restricting α. One means of restricting one of the α's, for example, $\alpha_{pnp}$, is to make emitter efficiency $\gamma_{E2}$ of the PNP section low (consider Equation 7). A way to illustrate this effect is shown in FIGURE 2 of the drawings where a calculated value for turn off capability $\beta_{off}$ is plotted along the axis or ordinates as a function of the ratio of device current to holding current, $I/I_H$, (plotted along the axis of abscissas for several values of emitter injection efficiency $\gamma_{E2}$). For this purpose, $\alpha_{npn}$ is assumed constant at 0.9. $\alpha_{pnp}$ is assumed to have the form:

(9)
$$\alpha_{pnp}=\gamma_{E2}\exp(-L_0/I)$$

where $I_0$ is the current at which the device turns off. The hold current $I_H$ as obtained for the condition $\alpha_{npn}+\alpha_{pnp}=1$ is

(10)
$$I_H=\frac{I_0}{\ln\frac{\gamma_{E2}}{1-\alpha_{npn}}}$$

so that

(11)
$$\alpha_{pnp}=\gamma_{E2}\exp\left[-I_H\frac{\ln\left(\frac{E_2}{1-\alpha_{npn}}\right)}{1}\right]$$

Notice that the form for $\alpha_{pnp}$ is assumed. This assumption is not necessarily generally accepted but it is generally accepted that the α varies roughly exponentially with emitter current. The curves illustrate that for high values of injection efficiency, γ, the turn off gains are low. Further, the turn off gain for a given injection efficiency decreases as the current increases but levels off at some substantially minimum value for each emitter injection efficiency.

Now to the point of tailoring the current gain—load current characteristics through conductivity modulation. From Equations 7 and 8 respectively, it is seen that the current gain is directly proportional to emitter efficiency $\gamma$ and the emitter efficiency is a function of the conductivity of both the base $\sigma_B$ and the emitter $\sigma_E$. The emitter efficiency decreases as the ratio of the base to emitter conducitvity increases, and as has been previously pointed out, turn off gain increases as emitter efficiency decreases. Using these relationships the base conductivity $\sigma_B$ and the conductivity ration $\sigma_B/\sigma_E$ is adjusted by the relative doping (relative average impurity concentration) of the base and emitter layer so that the emitter efficiency at low current levels (e.g., 100 milliamperes or less) is of a proper value to produce a current gain $\alpha_{pnp}$ which makes the sum of current gains $\alpha_{pnp}+\alpha_{npn}$ very nearly unity. Thus, the device has a low value of holding current $I_H$ and turns on easily. The base conductivity $\sigma_B$ is also selected so that a significant conductivity modulation takes place in the base. The values are selected to produce a ratio of conductivities $\sigma_B/\sigma_E$ at the peak load current which makes the emitter efficiency at this level the proper magnitude to give a current gain ($\alpha_{pnp}$) which makes the current gain seem ($\alpha_{pnp}+\alpha_{npn}$) very nearly unity. In order for the conductivity modulation to take place to any significant degree the base conductivity must be low enough so that load current raises the carrier concentration in the base layer a significant amount. Raising carrier concentration reduces resistivity; hence, the name conducitvity modulation.

Semiconductor switching devices which operate in accordance with the principles of the present invention are illustrated in each of FIGURES 3 through 4, inclusive. In each of these figures, the semiconductor switching device given the reference numeral 10 is enclosed in a dashed line box. Each of the semiconductor switching devices has three terminals 11, 12 and 13 which are intended to be connected in the circuit where the switch is employed. In each case, the main current carrying terminals, the anode 11 and cathode 12, and the gate terminal 13 are given positions which are the same relative to the dashed line box 10. The main terminals 11 and 12 are connected in a main current carrying path of the circuit where the switch is used in such a way that the anode terminal 11 is positive relative to the cathode terminal 12. The gating terminal 13 is connected to a source which supplies the positive turn-on signal when the current path between the main terminals 11 and 12 is to be rendered highly conductive (turned on) and the negative turn off signal (negative relative to the cathode terminal 12) when the internal current path between the main terminals 11 and 12 is to be rendered high impedance (turned off).

As illustrated in FIGURE 3, the semiconductor switching device 10 includes two semiconductor elements 14 and 15 each of which is preferably made of a monocrystalline semi-conductor pellet. One of the semiconductor elements 14 is an NPN transistor. That is, the monocrystalline semiconductor pellet 14 has three layers with alternate layers of opposite conductivity type and the outer layers are layers having N conductivity type. The NPN transistor 14 has its lower and upper N type layers respectively connected directly to the main terminals 11 and 12 respectively. Transistor 14 is considered the main current carrying path for the switch although as will be seen later, the main current through the entire switch includes current through another path. When the transistor 14 is rendered non-conductive, it presents a high impedance path between the main terminals 11 and 12 and when rendered conductive, it presents a low impedance path between these terminals.

In order for transistor 14 to be conductive, a voltage must be applied across the outer layers which is positive at the collector layer (the lower layer which is connected to anode terminal 11) relative to the emitter layer (upper layer which is connected to the upper cathode terminal 12) and a current drive must be applied to the middle P type base layer. Thus, the transistor 14 is turned on or off by supplying or withholding base current drive at the base lead 16 which is connected to the internal P type base layer. The current (conventional current is used here) which flows into the lower N type collector layer of the transistor 14 is shown by an arrow labeled $I_C$, the emitter current is designated by the arrow pointing away from the upper N type emitter layer and labeled $I_E$ and the base current drive is designated by an arrow labeled $I_B$ adjacent the lead 16 which is connected to the internal P type base layer.

The second monocrystalline semiconductor pellet constitutes a four layer semiconductor switch of the gate turn off (GTO) type, which, as is typical, has four layers with alternate layers of opposite conductivity type. As illustrated, the layers starting from the bottom anode layer and reading upward are PNPN in conductivity type. The upper N type layer is considered the gate turn off switch cathode layer and the P type layer immediate adjacent to it has gating lead 17 connected to it as well as to the semiconductor switching device gating terminal 13. This P type layer is also connected by lead 16 to supply base current $I_B$ to the internal P type base layer of NPN transistor 14. The GTO anode layer is connected directly to the anode terminal 11 of the semiconductor switching device 10 and its cathode layer is connected directly to the cathode terminal 12 of the semiconductor switching device. The internal N type layer of GTO 15 is shown connected to the lower N type cathode layer of the transistor through a resistor 18. This resistor is shown so the circuit will be an equivalent circuit of the composite device illustrated in FIGURE 4, but for the purposes of the analysis below, this resistor is considered to be infinite.

As previously indicated, the transistor 14 is conductive when supplied with a base drive current $I_B$ and non conductive (that is of a high impedance) when the base current $I_B$ is not supplied. Further, the only source of base current $I_B$ is from the gate turn off switch 15. Thus, when the gate turn off switch 15 is conductive (in its low impedance state) the transistor 14 is conductive and the semiconductor switching device 10 is conductive (in its low impedace mode). Conversely, when GTO 15 is not conductive, transistor 14 does not have a base current drive and is in its non-conductive state and thus, the semiconductor switching device 10 is non-conductive.

GTO 15, when non-conductive, is rendered conductive by a positive gating voltage applied at the gating terminal 13 (that is positive relative to the voltage at cathode terminal 12). Once GTO is rendered conductive, it supplies a base current drive $I_B$ to the transistor 14 which continues until GTO 15 is rendered non-conductive either through the usual negative gate turn off signal at terminal 13 (negative relative to cathode terminal 12) or by a reduction of voltage between device anode and cathode terminals 11 and 12. Since the gate turn off mechanism for this device has already been explained in great detail, it will not be repeated here. However, from this description it is seen that the current which can be handled by transistor 14 is controlled (turned on or turned off) by the GTO 15.

It is to be understood that the particular circuit illustrated is for an NPN type transistor with a particular gate turn off switch 15 but the circuit is equally operable with the dual of these devices. That is, the transistor could be a PNP and the gate turn off device could be of the opposite type.

In order to analyze this circuit in more detail, we will use the same set of symbols used in connection with FIGURE 1 and assume that GTO 15 is conductive and thus supplying base current $I_B$ to the transistor 14. Under these circumstances, Equations 1 and 2 may be modified by the substitution of the base current $I_B$ for gate current $I_G$ where appropriate and the following equations are obtained:

$$I_{E2}\alpha_{PNP}-I_B=(1-\alpha_{NPN})I_{E1} \quad (12)$$

$$I_{E1}\alpha_{NPN}=(1-\alpha_{PNP})I_{E2} \quad (13)$$

$$I_{E1}=I_{E2}-I_B \quad (14)$$

Substituting Equation 14 into the sum of Equation 12 and 13 we get $$\alpha_{NPN}I_{E2}-\alpha_{NPN}I_B=(1-\alpha_{PNP})I_{E2} \quad (15)$$

which reduces to $$I_B=\left(\frac{\alpha_{PNP}+\alpha_{NPN}-1}{\alpha_{NPN}}\right)I_{E2} \quad (16)$$

Looking at the transistor the collector current $I_C\alpha_T$ is the ratio of collector current to emitter current and $I_E$ is the emitter current, then $$I_C=\alpha_T I_E \quad (17)$$

or $$(1-\alpha_T)I_E=I_B \quad (18)$$

Combining Equations 16 and 18 we obtain $$\left(\frac{\alpha_{PNP}+\alpha_{NPN}-1}{\alpha_{NPN}}\right)I_{E2}=(1-\alpha_T)I_E \quad (19)$$

or $$I_E=\left(\frac{\alpha_{PNP}+\alpha_{NPN}-1}{\alpha_{NPN}(1-\alpha_T)}\right)I_{E2} \quad (20)$$

Assuming $I_{E1}$ approximately equals $I_{E2}$ Equation 20 reduces to $$I_E=\left(\frac{\alpha_{PNP}+\alpha_{NPN}-1}{\alpha_{NPN}(1-\alpha_T)}\right)I_{E1} \quad (21)$$

Using easily obtained alphas in the above equation (viz. $\alpha_{PNP}=0.1$, $\alpha_{NPN}=.95$ and $\alpha_T=.95$), the total device current becomes two or more times as large as the current of the gate turn off device. Thus, the gate current which turns off the gate turn off device is now capable of turning off at least two times as much current. Consequently, if the turn off gain of the gate turn off switch 15 is 20, the turn off gain of the total device is at least 2×20 or 40. Turn off gains for devices constructed in accordance with the teaching of this embodiment have been constructed with gains of up to 100.

The composite single pellet monocrystalline structure which is the equivalent of the two pellet switching device of FIGURE 3 is illustrated in FIGURE 4. The single pellet 20 is composed of four layers of opposite conductivity type arranged with interal P and N type layer 21 and 22, respectively, which extend across the entire pellet, a lower P type layer 23 which is formed in lower surface of the internal N type layer 22 and extends only part way across the pellet 20 and an external N type layer 24 at the upper surface of pellet 20 and formed in the internal P type layer 21 in such a manner that an edge protrudes over an edge of the P type layer 23 on the opposite outer surface. In order more clearly to illustrate how the single pellet 20 simulates the composite structure of FIGURE 3, a vertical section line AA is drawn through the pellet. The portion of the pellet 20 to the left of the section line in the drawing is equivalent to the NPN transistor 14 of FIGURE 3 and that portion to the right of the section line AA is equivalent to GTO 15 as illustrated in FIGURE 3. That is, to the left of the section line AA the monocrystalline pellet 20 is composed of N type emitter layer 24, internal P type base layer 21 and N type collector layer 22. On the right of section line AA, N type layer 24 has a portion which corresponds to the upper N type cathode layer of gate turn off device 15, the next layer down is the P type layer 21 which has ohmic gate contact 25 connected to it and corresponds to the internal P type layer of gate turn off device 15 of FIGURE 3. The next layer (reading down) is N type layer 22 which corresponds to the internal N type layer of GTO 15 of FIGURE 3 and the lower P type layer 23 corresponds to the external P type anode layer of GTO 15.

An ohmic contact 26 is connected to the upper N type layer 24 and to device cathode terminal 12. On the bottom surface of pellet 20 an ohmic contact 27 shorts the lower P type layer 23 to the internal N type region 22 and is connected directly to the anode terminal 11 of the switching device just as the lower N type collector layer of transistor 14 and lower P type anode layer of GTO 15 are connected directly to the anode terminal 11 in FIGURE 3. As is previously indicated, an ohmic contact 25 on the internal P type layer 21 is connected directly to the gating terminal 13. Since the P type layer 21 is common to both the transistor and GTO, a connection equivalent to the lead 16 through which base current is supplied from GTO 15 to transistor 14 is provided. The internal N type layer 22 has a relatively high resistivity and simulates resistor 18 between the N type layer of GTO 15 and the lower N type layer of transistor 14.

Since the circuit of FIGURE 3 is the equivalent circuit for the composite device of FIGURE 4 and since the operation of this circuit has been described, it is believed that further discussion of the operation of the device of FIGURE 4 is not warranted or necessary. However, it may be desirable to discuss one method of forming the pellet 20. The pellet 20 is made starting with a silicon pellet about six mils thick and of N conductivity type with a resistivity of 15 to 20 ohm centimeters (impurity concentration of about $2.5\times(10)^{14}$ atoms per cc.). This material ultimately forms the N type layer 22. The pellet 20 is gallium diffused to a depth of about 1 mil so that P conductivity layers are formed on both sides of the N type layer 22. The P type layer on one side ultimately forms the internal P type layer 21. After gallium diffusion, one layer of P type material is completely removed (a little more than 1 mil is removed to make sure) by lapping or etching to leave a 2 layer PN pellet. The pellet is masked by conventional masking techniques and then phosphorous diffused at the upper surface to a depth of about ½ mil to form the upper N type layer 24 of the configuration illustrated in FIGURE 4. The pellet is then cleaned and again masked in such a way that the lower P type layer may be diffused in. This diffusion step involves diffusing in boron to a depth of approximately ½ mil. Characteristics may then be altered if necessary by lapping either the upper or lower surface to change thickness of the layers.

Thus the objects of this invention have been accomplished by providing a semiconductor switching device capable of being switched between high and low impedance modes which includes providing a transistor portion in the main current carrying path and a gate turn off device portion to supply base current to the transistor portion of the device which accomplishes switching of the transistor between high and low conduction modes. While particular embodiments of the invention have been shown, it will, of course, be understood that the invention is not limited thereto since many modifications both in the circuit arrangements and instrumentalities employed may be made. For example, the dual of any of the illustrated arrangements is contemplated. It is contemplated that the appended claims will cover any such modifications as fall within the true spirit and scope of the invention.

What is claimed as new and desired to be secured by Letters Patent of the United States is:

1. A semiconductor switching device adapted to be connected in a main current conducting path and switched between high and low impedance modes including in combination (A) three terminals including (a) a pair of main terminals adapted to be connected in a main current carrying path (b) a gating terminal for switching the semiconductor switching device between its high and low impedance states, (B) monocrystalline semiconductor switching means including (a) a pair of semiconductor pellets (1) one of said semiconductor pellets having three layers with alternate layers of opposite conductivity type thereby forming a transistor with two outer layers of one conductivity type separated by a base region of opposite conductivity type, and (2) the other one of said semiconductor pellets consisting of four layers with alternate layers of opposite conductivity type forming a four layer semiconductor switch of the gate turn off type, (3) said transistor having its two outer layers electrically connected between said pair of main terminals so that its three layers are in the main current conducting path of the switching device and (4) each of its three layers is electrically connected to three consecutive layers of said gate turn off device in such a manner that connected layers are of like conductivity whereby current to the base of said transistor is supplied by said gate turn off device (5) the layer of said gate turn off device which is electrically connected to the base layer of said transistor being electrically connected to said gating terminal whereby said gate turn off device can be rendered selectively conductive and non-conductive respectively in response to signals at said gate thereby to render said transistor selectively conductive and non-conductive respectively and thus cause the switching device selectively to present a low and high impedance respectively in the main current conducting path.

2. A semiconductor switching device adapted to be connected in a main current conducting path and switched between high and low impedance modes including in combination (A) three terminals including (a) a pair of main terminals adapted to be connected in a main current carrying path (b) a gating terminal for switching the semiconductor switching device between its high and low impedance states, (B) monocrystalline semiconductor switching means including (a) at least one monocrystalline semiconductor pellet (1) said monocrystalline semiconductor pellet having a three layer region with alternate layers of opposite conductivity type thereby forming a transistor with two outer layers of one conductivity type separated by a base region of opposite conductivity type, and (2) a second region consisting of four layers with alternate layers of opposite conductivity type forming a four layer semiconductor switch of the gate turn off type, (3) said transistor having its two outer layers electrically connected between said pair of main terminals so that its three layers are in the main current conducting path of the switching device, and (4) each of its three layers is electrically connected to three consecutive layers of said gate turn off device in such a manner that connected layers are of like conductivity whereby current to the base of said transistor is supplied by said gate turn off device, and (5) the layer of said gate turn off device which is electrically connected to the base layer of said transistor being electrically connected to said gating terminal whereby said gate turn off device can be rendered selectively conductive and non-conductive respectively in response to signals at said gate thereby to render said transistor selectively conductive and non-conductive respectively and thus cause the switching device selectively to present a low and high impedance respectively in the main current conducting path.

3. A semiconductor switching device adapted to be connected in a main current conducting path and switched between high and low impedance modes including in combination (A) three terminals including (a) a pair of main terminals adapted to be connected in a main current carrying path (b) a gating terminal for switching the semiconductor switching device between its high and low impedance states, (B) monocrystalline semiconductor switching means comprising (a) one monocrystalline semiconductor pellet (1) said monocrystalline semiconductor pellet having a three layer region with alternate layers of opposite conductivity type thereby forming a transistor with two outer layers of one conductivity type separated by a base region of opposite conductivity type, and (2) a second region consisting of four layers with alternate layers of opposite conductivity type forming a four layer semiconductor switch of the gate turn off type, (3) the three layers of said transistor device constituting three of the said four layers of said gate turn off device, (4) a first ohmic contact connected to said internal layer of said four layer gate turn off device which constitutes the said base layer of said transistor, (5) a second ohmic contact connected to the common outside layer of said transistor and said gate turn off device adjacent said internal transistor base layer, and (6) a third ohmic contact connecting the other outer external layer of said four layer gate turn off device to the adjacent outer layer of said transistor device, (7) said second and third ohmic contacts each connected to one of said pair of main terminals whereby said transistor portion has its two outer layers electrically connected between said pair of main terminals so that its three layers are in the main current conducting path of the switching device, and (8) said first ohmic contact being electrically connected to said gating terminal whereby said gate turn off device can be rendered selectively conductive and non-conductive respectively in response to signals at said gate thereby to render said transistor selectively conductive and non-conductive respectively and thus cause the switching device selectively to present a low and high impedance respectively in the main current conducting path.

References Cited by the Applicant

UNITED STATES PATENTS 2,993,154 7/1961 Goldey.

OTHER REFERENCES

"Turn-Off-gain in p-n-p-n Triodes," by J. M. Goldey, I. M. Mackintosh & I. M. Ross, Solid State Electronics, 1961, vol. 3, pp. 119–122.

ARTHUR GAUSS, *Primary Examiner.*

E. H. EPSTEIN, *Assistant Examiner.*